(12) United States Patent
Nishimura et al.

(10) Patent No.: US 9,584,093 B2
(45) Date of Patent: Feb. 28, 2017

(54) VIBRATING DEVICE

(71) Applicant: Murata Manufacturing Co., Ltd., Nagaokakyo-shi, Kyoto-fu (JP)

(72) Inventors: Toshio Nishimura, Nagakakyo (JP); Takashi Hase, Nagaokakyo (JP); Keisuke Takeyama, Nagakakyo (JP); Hiroaki Kaida, Nagaokakyo (JP); Keiichi Umeda, Nagaokakyo (JP); Takehiko Kishi, Nagaokakyo (JP); Hiroshi Yamada, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 14/933,336

(22) Filed: Nov. 5, 2015

(65) Prior Publication Data
US 2016/0072473 A1      Mar. 10, 2016

Related U.S. Application Data

(63) Continuation of application No. PCT/JP2014/062080, filed on May 1, 2014.

(30) Foreign Application Priority Data

May 13, 2013   (JP) .................................. 2013-101300
May 20, 2013   (JP) .................................. 2013-105964

(51) Int. Cl.
*H03H 9/21*          (2006.01)

(52) U.S. Cl.
CPC ..................... *H03H 9/21* (2013.01)

(58) Field of Classification Search
CPC ...... G01C 19/5607; H03H 9/21; H03H 9/215; H03H 9/2468; H03H 9/2473; H03H 9/2484; H03H 9/2494
(Continued)

(56) References Cited

U.S. PATENT DOCUMENTS 5,824,900 A  * 10/1998  Konno ............... G01C 19/5607
                                                          310/311
2009/0178260 A1* 7/2009  Yamazaki ................ H03H 3/04
                                                          29/25.35

(Continued)

FOREIGN PATENT DOCUMENTS

JP          3380478 B2     12/2002
JP       2004-274589 A      9/2004
(Continued)

OTHER PUBLICATIONS

International Search Report issued for PCT/JP2014/062080, date of mailing Aug. 5, 2014.
(Continued)

*Primary Examiner* — J. San Martin
(74) *Attorney, Agent, or Firm* — Arent Fox LLP

(57) ABSTRACT

A vibrating device having a number 2N (N is an integer equal to 2 or larger) of tuning fork arms extending in a first direction are arranged side by side in a second direction. Phases of flexural vibrations of the number N of tuning fork arms positioned at a first side of an imaginary line A, which passes a center of a region in the second direction where the number 2N of tuning fork arms are disposed and which extends in the first direction, are symmetric to phases of flexural vibrations of the number N of tuning fork arms positioned at a second side of the imaginary line opposite the first side.

17 Claims, 8 Drawing Sheets

(58) Field of Classification Search
USPC .......................................................... 310/370
See application file for complete search history.

(56) References Cited

U.S. PATENT DOCUMENTS

| | | | |
|---|---|---|---|
| 2010/0013360 A1 | 1/2010 | Baborowski et al. | |
| 2010/0156237 A1 | 6/2010 | Ichikawa et al. | |
| 2010/0201223 A1* | 8/2010 | Ishii | H03H 9/0509 310/321 |
| 2010/0244989 A1* | 9/2010 | Furuhata | H03H 9/215 333/197 |
| 2011/0014069 A1 | 1/2011 | Wada et al. | |
| 2011/0187470 A1* | 8/2011 | Yamada | H03B 5/30 331/155 |
| 2012/0126664 A1* | 5/2012 | Ogura | G01C 19/5607 310/312 |
| 2012/0194283 A1 | 8/2012 | Funakawa et al. | |
| 2013/0283910 A1* | 10/2013 | Nishizawa | H01L 41/0475 73/504.12 |
| 2013/0312519 A1* | 11/2013 | Ichikawa | G01C 19/5607 73/504.12 |
| 2014/0290362 A1* | 10/2014 | Nakagawa | G01C 19/5607 73/504.16 |
| 2015/0116050 A1* | 4/2015 | Nakagawa | H03H 9/21 331/156 |
| 2016/0065173 A1* | 3/2016 | Nishimura | H01L 41/0478 310/363 |

FOREIGN PATENT DOCUMENTS

| | | |
|---|---|---|
| JP | 2009-005022 A | 1/2009 |
| JP | 2010-028535 A | 2/2010 |
| JP | 2010-060960 A | 3/2010 |
| JP | 2010-147954 A | 7/2010 |
| JP | 2011-160250 A | 8/2011 |
| JP | 2011-223489 A | 11/2011 |
| JP | 2012-015886 A | 1/2012 |
| JP | 2012-065293 A | 3/2012 |
| JP | 2012-105044 A | 5/2012 |
| JP | 2013-062643 A | 4/2013 |
| WO | WO 2008/043727 A1 | 4/2008 |
| WO | WO 2009/119431 A | 10/2009 |
| WO | WO 2010/062847 A2 | 6/2010 |
| WO | WO 2012/110708 A1 | 8/2012 |
| WO | WO 2012/156585 A1 | 11/2012 |

OTHER PUBLICATIONS

Written Opinion of the International Searching Authority issued for PCT/JP2014/062080, date of mailing Aug. 5, 2014.

* cited by examiner

US 9,584,093 B2

VIBRATING DEVICE

CROSS REFERENCE TO RELATED APPLICATIONS

The present application is a continuation of International application No. PCT/JP2014/062080, filed May 1, 2014, which claims priority to Japanese Patent Application No. 2013-101300, filed May 13, 2013, and Japanese Patent Application No. 2013-105964, filed May 20, 2013, the entire contents of each of which are incorporated herein by reference.

FIELD OF THE INVENTION

The present invention relates to a vibrating device including a plurality of tuning fork arms as vibrating portions.

BACKGROUND OF THE INVENTION

Various types of vibrating devices each including a plurality of tuning fork arms have been proposed so far. For example, Patent Document 1, given below, discloses a vibrating device including three tuning fork arms. In Patent Document 1, the width of the tuning fork arm positioned at a center is twice that of each of the tuning fork arm positioned at both the sides.

Patent Document 2, given below, also discloses a vibrating device including three tuning fork arms. Patent Document 2 describes an electrode connection method for vibrating a tuning fork arm at a center and tuning fork arms at outer sides in opposite phases.

Patent Document 1: WO2008/043727
Patent Document 2: Japanese Unexamined Patent Application Publication No. 2009-5022

SUMMARY OF THE INVENTION

To achieve stable oscillation in the vibrating device including a plurality of tuning fork arms, resonance resistance needs to be small. It is hence required to increase $k^2Q$, and to increase electrostatic capacitance. However, there is a problem that, when the electrostatic capacitance is increased by increasing the width of the tuning fork arm, $k^2Q$ is reduced.

An object of the present invention is to provide a vibrating device in which resonant resistance can be reduced by increasing electrostatic capacitance without reducing $k^2Q$.

The vibrating device according to the present invention includes a base portion, and a number 2N of tuning fork arms joined to one end of the base portion and extending in a Y-direction. In the present invention, N is an integer equal to 2 or larger.

In the present invention, the number 2N of tuning fork arms are arranged side by side in an X-direction that is perpendicular to the Y-direction. Each of the tuning fork arms causes flexural vibration in a Z-direction that is perpendicular to the X-direction and the Y-direction.

In the present invention, phases of the flexural vibrations of the number N of tuning fork arms positioned at one side of an imaginary line, which passes a center of a region in the X-direction where the number 2N of tuning fork arms are disposed, and which extends in the Y-direction, are symmetric to phases of the flexural vibrations of the number N of tuning fork arms positioned at the other side of the imaginary line.

According to one specific aspect of the vibrating device of the present invention, the number N is two, and the two tuning fork arms positioned at the inner side in the X-direction and the two tuning fork arms positioned at the outer side in the X-direction cause the flexural vibrations in opposite phases.

According to another specific aspect of the vibrating device of the present invention, each of the tuning fork arms includes a Si layer made of a degenerate semiconductor, a silicon oxide layer, a piezoelectric layer, and first and second electrodes through which a voltage is applied to the piezoelectric layer.

According to still another specific aspect of the vibrating device of the present invention, the Si layer is doped with an n-type dopant. The dopant is preferably phosphorus (P).

According to still another specific aspect of the vibrating device of the present invention, a width of an end portion of each tuning fork arm at the side opposite to an end portion thereof joined to the base portion is larger than a width of the end portion joined to the base portion.

According to still another specific aspect of the vibrating device of the present invention, a mass adding portion is provided at the end portion of each tuning fork arm at the side opposite to the end portion thereof joined to the base portion, the mass adding portion having a larger width than a remaining portion.

With the vibrating device according to the present invention, since the number 2N of tuning fork arms are disposed and the phases of the flexural vibrations of the number N of tuning fork arms positioned at one side of the imaginary line passing the center in the X-direction are symmetric to the phases of the flexural vibrations of the number N of tuning fork arms positioned at the other side of the imaginary line, the electrostatic capacitance can be increased without reducing $k^2Q$. Therefore, the resonant resistance can be reduced. Hence satisfactory vibration characteristics can be obtained.

DETAILED DESCRIPTION OF THE PREFERRED EMBODIMENTS

Practical embodiments of the present invention will be described below with reference to the drawings for clear understanding of the present invention.

Figure 1A:
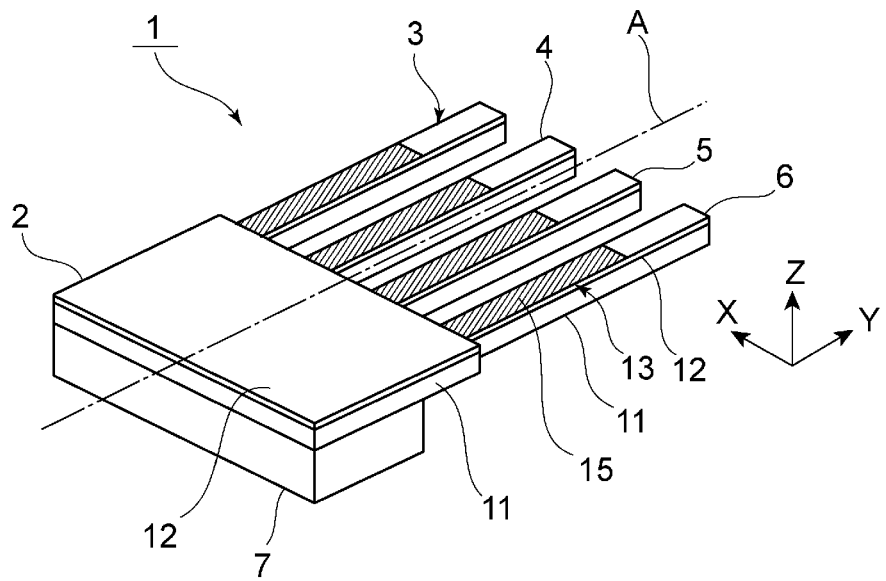
FIG. 1(a) is a perspective view of a vibrating device according to a first embodiment of the present invention.
Figure 1B:
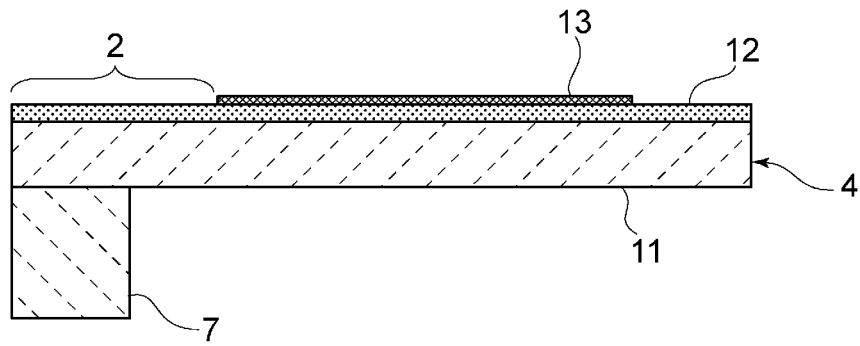
FIG. 1(b) is a front sectional view of the vibrating device.
Figure 1C:
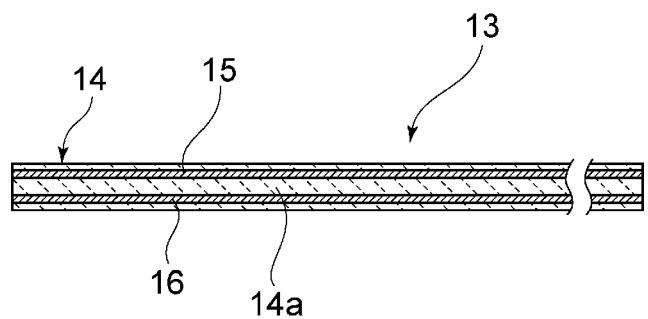
FIG. 1(c) is a front sectional view, partly cut-away, of an excitation portion used in the first embodiment.

FIG. 1(a) is a perspective view of a vibrating device according to a first embodiment of the present invention, FIG. 1(b) is a front sectional view of the vibrating device, and FIG. 1(c) is a front sectional view, partly cut-away, of an excitation portion used in the first embodiment.

The vibrating device 1 includes a base portion 2. Respective one ends of four tuning fork arms 3 to 6 are joined to the base portion 2.

The base portion 2 is in the form of a rectangular plate. The respective one ends of the four tuning fork arms 3 to 6 each extending in a lengthwise direction are joined to one lateral surface of the base portion 2.

A support portion 7 is fixed to a lower surface of the base portion 2. The support portion 7 serves as a portion used for fixing the vibrating device 1 to the outside.

Here, as illustrated in FIG. 1(a), the direction in which the tuning fork arms 3 to 6 extend is defined as a Y-direction. A direction perpendicular to the Y-direction in a plane, which is parallel to both principal surfaces of the base portion 2, is defined as an X-direction. The lateral surface to which the respective one ends of the tuning fork arms 3 to 6 are joined extends in the X-direction. Accordingly, the four tuning fork arms 3 to 6 are arranged side by side in the X-direction.

A Z-direction is defined as a direction perpendicular to a plane that is specified by the X-direction and the Y-direction. In this embodiment, the four tuning fork arms 3 to 6 cause flexural vibrations in the Z-direction as described later.

As illustrated in FIG. 1(b), the support portion 7 is formed integrally with a Si layer 11 of the base portion 2. The support portion 7 may be made of a semiconductor material or an insulating material, such as Si or $Al_2O_3$.

The support portion 7 may be bonded to the base portion 2 by employing an adhesive.

The base portion 2 has a structure in which a silicon oxide layer 12 is laminated on the Si layer 11. The tuning fork arm 4 also has a structure in which a silicon oxide layer 12 is laminated on a Si layer 11. In other words, the Si layer 11 and the silicon oxide layer 12 in the tuning fork arm 4 are formed integrally with the Si layer 11 and the silicon oxide layer 12 in the base portion 2, respectively.

The tuning fork arms 3, 5 and 6 are also constituted similarly to the tuning fork arm 4.

The Si layer 11 is made of a degenerate semiconductor. In this embodiment, the Si layer is made of an n-type Si semiconductor. Because the Si layer is a degenerate semiconductor, the doping concentration of an n-type dopant therein is $1 \times 10^{19}/cm^3$ or more. An example of the n-type dopant is a group 15 element, such as P, As or Sb. Preferably, P is used as the dopant. In that case, an n-type degenerate semiconductor can be manufactured easily.

Figure 8:
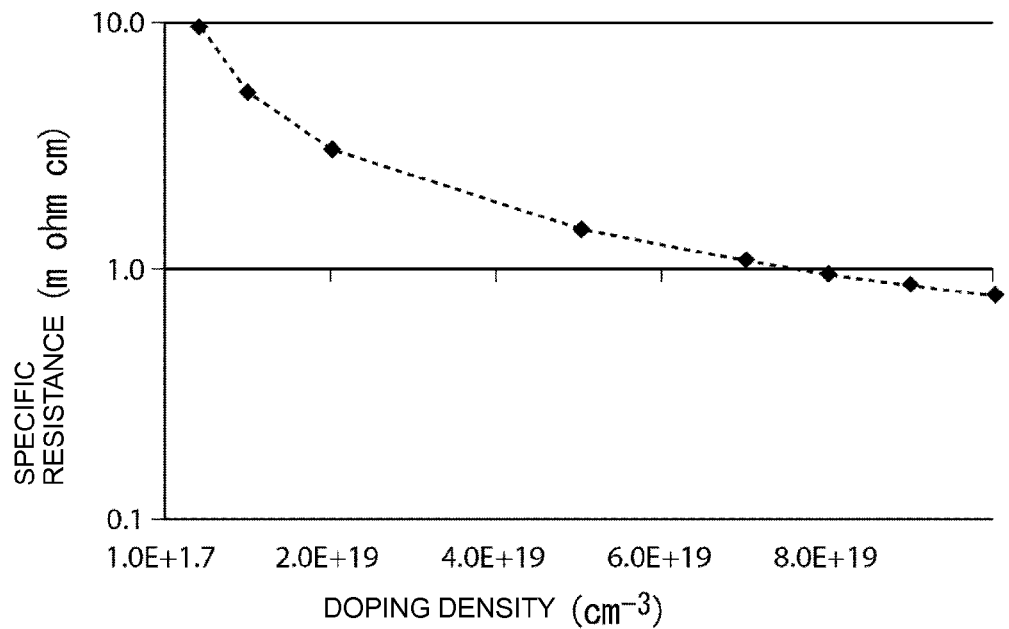
FIG. 8 is a graph depicting a relationship between a doping density of P in the Si layer and specific resistance of the Si layer.

In this embodiment, the Si layer is made of an n-type Si semiconductor in which phosphorous is doped at the concentration of $5 \times 10^{19}/cm^3$. Since the doping density of phosphorous (P) is $5 \times 10^{19}/cm^3$, the n-type Si semiconductor has specific resistance of 1.5 mΩ·cm or less as illustrated in FIG. 8, and hence it is a degenerate semiconductor.

The silicon oxide layer 12 is made of $SiO_2$ in this embodiment. Thus, in this embodiment, the silicon oxide layer 12 made of $SiO_2$ is laminated on an upper surface of the Si layer 11.

In the base portion 2, the silicon oxide layer 12 may be dispensed with. It is, however, desired that the silicon oxide layer 12 is provided as in this embodiment. With the provision of the silicon oxide layer, a manufacturing process can be simplified.

The silicon oxide layer 12 can be made of, without being limited to $SiO_2$, a silicon oxide-based material having a proper composition expressed by $Si_aO_b$ (a, b: integer).

As illustrated in FIG. 1(c), an excitation portion 13 includes a piezoelectric thin film 14, a first electrode 15, and a second electrode 16. The first electrode 15 and the second electrode 16 are disposed in a state sandwiching a part of the piezoelectric thin film 14, i.e., a piezoelectric thin film layer 14a, between them. The first and second electrodes 15 and 16 are not always required to be buried in the piezoelectric thin film 14. In another example, the first and second electrodes 15 and 16 may be formed on an upper surface and a lower surface of the piezoelectric thin film 14, respectively.

Moisture resistance, etc. can be increased by arranging the first and second electrodes 15 and 16 within the piezoelectric thin film 14 as in this embodiment. Moreover, the structure in which the first electrode 15 and the second electrode 16 are provided in the state sandwiching the piezoelectric thin film 14 between them is easier to manufacture. In addition, the direction of an electric field generated by the first electrode 15 and the second electrode 16 can be kept in one direction. Accordingly, the excitation portion having high excitation efficiency can be constituted.

A piezoelectric material constituting the piezoelectric thin film 14 is not limited to particular one. In a vibrating device utilizing a bulk wave, however, a Q-value is preferably as high as possible. For that reason, AlN having a small electromechanical coupling coefficient $k^2$, but having a high Q-value is suitably used.

ZnO, Sc-substituted AlN, PZT, KNN, etc. may be used instead of AlN. In the case using a Sc-substituted AlN film (SLAlN), a Sc concentration is desirably about 0.5 at % to 50 at % on condition that an atomic concentration of Sc and Al is 100 at %.

ScAlN has a larger electromechanical coupling coefficient $k^2$ than AlN, and has larger mechanical Qm than PZT and KNN. Accordingly, when ScAlN is applied to a resonant vibrator as in the present invention, the following advantages can be obtained. An exemplary application of the resonant vibrator is an oscillator. In a TCXO (temperature compensated (crystal) oscillator), for example, a signal from a built-in temperature sensor is fed back to a variable capacitance element, which is connected in series to the vibrator, thereby changing a capacitance value of the variable capacitance element. As a result, an oscillation frequency can be adjusted. On that occasion, when ScAlN is used as the piezoelectric thin film instead of AlN, a specific band of the resonant vibrator is widened. Hence an adjustment range of the oscillation frequency can be widened.

Similarly, when ScAlN is used in a VCXO (voltage controlled oscillator), an adjustment range of the oscillation frequency is widened. Accordingly, initial frequency variations of the resonant vibrator can be adjusted by the variable capacitance element. Hence the cost of a frequency adjusting step can be reduced greatly.

The first and second electrodes 15 and 16 can be each formed by employing a proper metal, such as Mo, Ru, Pt, Ti, Cr, Al, Cu, Ag, Au or an alloy of those elements.

The piezoelectric thin film 14 is polarized in the thickness direction. By applying an alternating electric field between the first and second electrodes 15 and 16, therefore, the excitation portion 13 is excited due to the piezoelectric effect. As a result, each of the tuning fork arms 3 to 6 causes flexural vibration in the Z-direction.

In this embodiment, of the four tuning fork arms 3 to 6, the two tuning fork arms 4 and 5 positioned in a central region and the two tuning fork arms 3 and 6 positioned at both the outer sides cause flexural vibrations in the Z-direction in opposite phases. Such a state can be achieved by, in the tuning fork arms 3 to 6, making their piezoelectric thin film layers 14a polarized in the same manner in the thickness direction, and making the phase of the alternating electric field for driving the tuning fork arms 4 and 5 opposite to the phase of the alternating electric field for driving the tuning fork arms 3 and 6. As an alternative, the direction of polarization of the piezoelectric thin film layer 14a in each of the tuning fork arms 4 and 5 may be set opposite to that of the piezoelectric thin film layer 14a in each of the tuning fork arms 3 and 6, and alternating electric fields in the same phase may be applied to the tuning fork arms 3 to 6.

In the vibrating device 1 of this embodiment, as described above, in the X-direction, the tuning fork arms 4 and 5 positioned in the center region and the tuning fork arms 3 and 6 positioned at both the outer sides cause flexural vibrations in opposite phases. Stated in another way, the number of the tuning fork arms 3 and 6 vibrating in one phase is equal to the number of the tuning fork arms 4 and 5 vibrating in the other phase. Therefore, even when the width of the tuning fork arm is increased in each of the tuning fork arms 3 to 6, electrostatic capacitance can be increased without reducing $k^2Q$ significantly. Hence resonant resistance can be sufficiently reduced. That point will be described below with reference to FIGS. 5 and 6.

The vibrating device according to the above-described embodiment and vibrating devices, each including three tuning fork arms, according to first and second comparative examples were fabricated as follows.

The vibrating device of the above-described embodiment (called Embodiment): the silicon oxide layer 12 having a thickness of 0.5 μm was formed on the Si layer 11 having a thickness of 10 μm. The base portion 2 had a multilayer structure of those two layers. In each of the tuning fork arms 3 to 6, the excitation portion 13 was provided by forming the piezoelectric thin film 14, made of AlN and having a thickness of 0.8 μm, on the upper surface of the multilayer structure, and by forming the electrodes, made of Mo and having respectively thicknesses of 0.1 μm and 0.1 μm, on both the surfaces of the piezoelectric thin film 14.

The length and the width of each of the tuning fork arms 3 to 6 were set to 650 μm and 20 μm, respectively. The thickness of each tuning fork arm was set to about 11.5 μm with the provision of the above-described multilayer structure.

Comparative Example 1 the vibrating device of Comparative Example 1 was similar to that of Embodiment except for including three tuning fork arms.

Comparative Example 2 in the vibrating device of Comparative Example 2, three tuning fork arms were provided as in Comparative Example 1. However, the width of the tuning fork arm at the center was set to be twice that of each of the tuning fork arms at both the sides.

The three types of vibrating devices were fabricated as described above.

Figure 5:
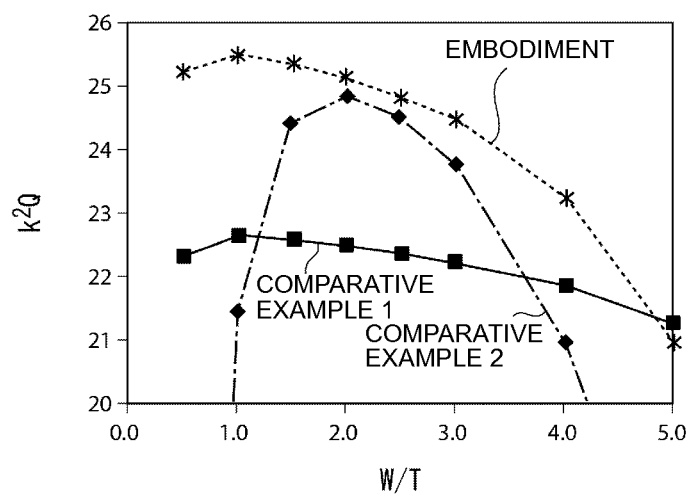
FIG. 5 is a graph depicting a relationship between W/T, i.e., a ratio of a width W to a thickness T of a tuning fork arm, and $k^2Q$.
Figure 6:
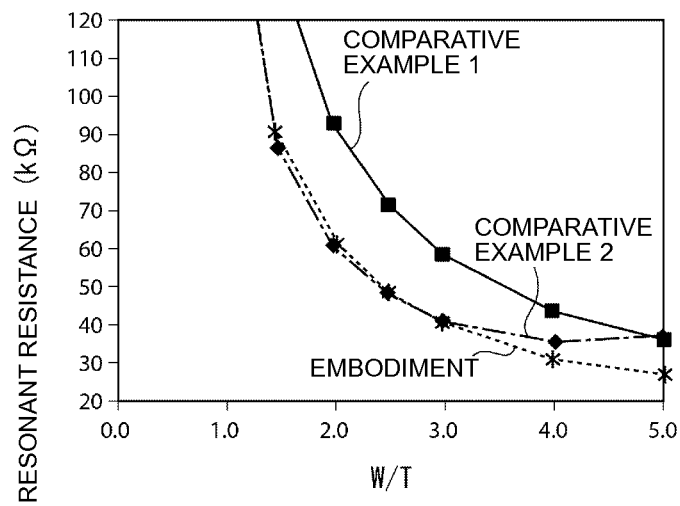
FIG. 6 is a graph depicting a relationship between W/T, i.e., the ratio of the width W to the thickness T of the tuning fork arm, and resonant resistance.

FIG. 5 is a graph depicting a relationship between $k^2Q$ and a ratio W/T in the vibrating devices of Embodiment and Comparative Examples 1 and 2. FIG. 6 is a graph depicting a relationship between resonant resistance R1 and the ratio W/T in the vibrating devices of Embodiment and Comparative Examples 1 and 2. In those graphs, W denotes the width of the tuning fork arm, and T denotes the thickness of the tuning fork arm.

In Embodiment and Comparative Example 2, as seen from FIG. 5, since an excitation electrode area is relatively large, the electrostatic capacitance can be increased. Accordingly, a value of the resonant resistance can be reduced as seen from FIG. 6.

It is also seen that, in Embodiment and Comparative Example 2, $k^2Q$ can be drastically increased from that in Comparative Example 1. The reason is that driving forces of the flexural vibrations in the Z-direction are balanced, and that the excitation efficiency is increased. Furthermore, in Embodiment, $k^2Q$ is entirely greater than that in Comparative Example 2. The reason is that the lock-in effect is improved due to the provision of the four tuning fork arms. As a result, in Embodiment, $k^2Q$ can be drastically increased when W/T is in a range of 0.5 to 4.8.

As seen from FIG. 6, when the resonant resistance of 60 kΩ is to be realized, it can be realized with W/T=3.0 in Comparative Example 1, W/T=2.0 in Comparative Example 2, and W/T=2.0 in Embodiment. In that case, values of $k^2Q$ in the vibrating devices are 22.2 in Comparative Example 1, 24.9 in Comparative Example 2, and 25.2 in Embodiment as seen from FIG. 5.

Thus, it is understood that, according to Embodiment, the resonant resistance can be effectively reduced without reducing $k^2Q$ significantly in comparison with Comparative Examples 1 and 2 each including the three tuning fork arms. Hence satisfactory vibration characteristics can be obtained.

While the above-mentioned results are obtained with the measurement in which the design value of the resonant resistance is set to 60 kΩ, similar results are obtained even when other design values are set.

For example, when the resonant resistance of 40 kΩ is to be realized, it can be realized with W/T=4.5 in Comparative Example 1, W/T=3.0 in Comparative Example 2, and W/T=3.0 in Embodiment. In that case, values of $k^2Q$ in the vibrating devices are 21.6 in Comparative Example 1, 23.9 in Comparative Example 2, and 24.5 in Embodiment.

Figure 7:
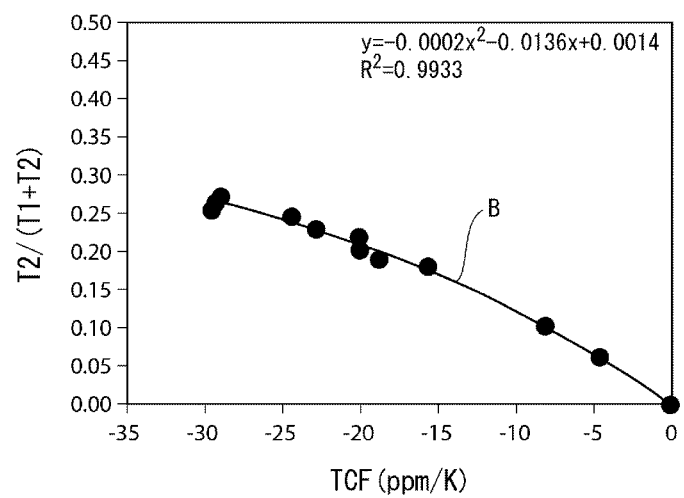
FIG. 7 is a graph depicting a relationship at which the temperature coefficient of resonant frequency (TCF) becomes 0 with lamination of a silicon oxide layer on an assumption that the TCF when the silicon oxide layer is not formed is denoted by X and a thickness ratio T2/(T1+T2) is denoted by y.

Furthermore, in the vibrating device 1 of this embodiment, assuming that the thickness of the silicon oxide layer 12 is denoted by T2 and the thickness of the Si layer 11 is denoted by T1, an absolute value of the temperature coefficient of resonant frequency (TCF) can be effectively reduced by setting a thickness ratio of the silicon oxide layer 12, expressed by T2/(T1+T2), is set to fall within a particular range. Such a point will be described below with reference to FIG. 7. The horizontal axis in FIG. 7 represents the TCF in a vibrating device in which the silicon oxide layer 12 is not provided. The TCF of the Si layer takes a particular value depending on the doping concentration. That particular value of the TCF is denoted by x, whereas the thickness ratio T2/(T1+T2) is denoted by y.

At many points plotted in FIG. 7, the temperature coefficient of resonant frequency (TCF) is 0 in the above-described embodiment in which the silicon oxide layer 12 is provided on the Si layer 11. A curve B is obtained with approximation on the basis of respective coordinates of those points, and is expressed by $y=-0.0002x^2-0.0136x+0.0014$. It is hence understood that the TCF can be made 0 by setting the thickness ratio T2/(T1+T2) to be positioned on the curve B.

Experiments conducted by the inventors have proved that, when the thickness ratio T2/(T1+T2) is within a range of $(-0.0002x^2-0.0136x+0.0014)\pm0.05$, the temperature coefficient of resonant frequency (TCF) can be kept within a range of 0±5 ppm/° C. For that reason, the thickness ratio T2/(T1+T2) of the silicon oxide layer 12 is preferably set to fall within the above-mentioned range.

In the first embodiment, the four tuning fork arms 3 to 6 are provided. In that case, even when the width of the tuning fork arm is increased, the resonant resistance can be effectively suppressed without reducing $k^2Q$ significantly. Such an effect can be obtained when the number of the tuning fork arms is 2N (N is an integer equal to 2 or larger), without being limited to the case where the number of the tuning fork arms is four. Stated in another way, it is just required that the number N of tuning fork arms are arranged at one side of an imaginary line A illustrated in FIG. 1(a) while the number N of tuning fork arms are arranged at the other side of the imaginary line A, and that phases of respective flexural vibrations of the number N of tuning fork arms at the one side and those of the number N of tuning fork arms at the other side are symmetric. The imaginary line A passes the center, in the X-direction in FIG. 1(a), of a region where the tuning fork arms 3 to 6 are disposed, and it extends in the Y-direction.

Moreover, in the first embodiment, $k^2Q$ can be effectively increased by controlling the spacings between particular twos among the four tuning fork arms 3 to 6. That point will be described in detail below with reference to FIGS. 9 and 10.

Figure 9:
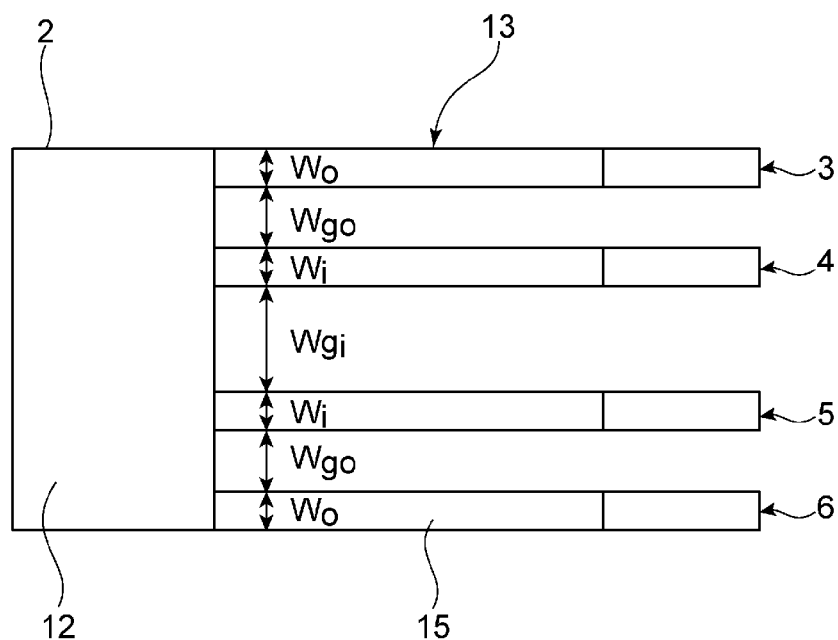
FIG. 9 is a schematic plan view of a vibrating device according to a modification of the first embodiment of the present invention.

FIG. 9 is a schematic plan view of a vibrating device according to a modification of the first embodiment of the present invention. As illustrated in FIG. 9, the spacings between the tuning fork arms 3, 6 positioned at both the outer sides and the tuning fork arms 4, 5 positioned adjacent to the tuning fork arms 3, 6 at both the outer sides and closer to the center are each denoted by Wgo. The spacing between the tuning fork arms 4 and 5 positioned closer to the center is denoted by Wgi.

Figure 10:
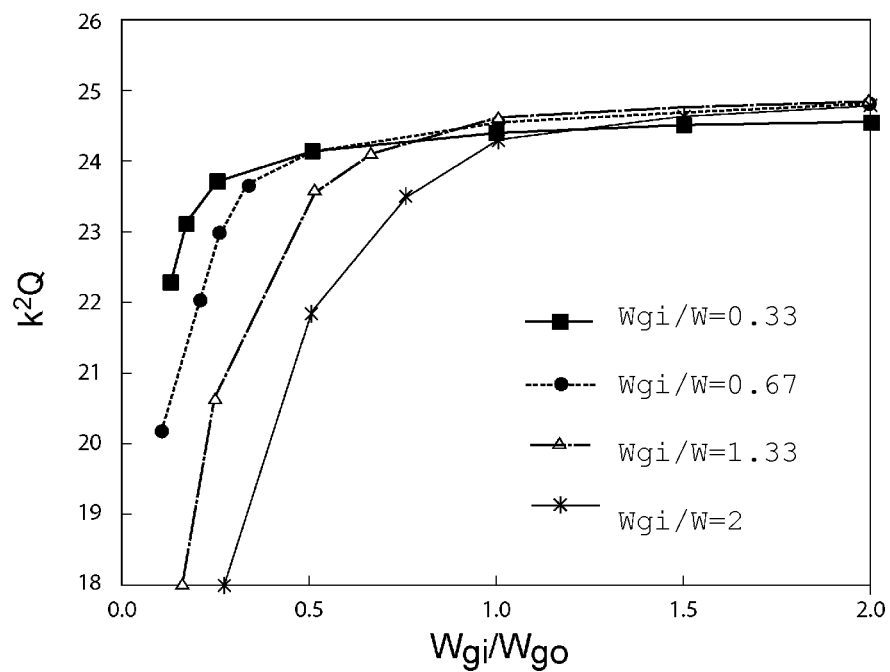
FIG. 10 is a graph depicting, in the vibrating device according to the modification of the first embodiment of the present invention, a relationship between $k^2Q$ and a ratio Wgi/Wgo, i.e., a ratio of a spacing Wgi between tuning fork arms positioned closer to the center to a spacing Wgo between tuning fork arms at both the outer sides and the tuning fork arms positioned adjacent to the tuning fork arms at both the outer sides and closer to the center.

FIG. 10 is a graph depicting a relationship between Wgi/Wgo, i.e., a ratio of Wgi to Wgo, and $k^2Q$. To determine the relationship between the ratio Wgi/Wgo and $k^2Q$ in FIG. 10, the vibrating devices were fabricated as follows.

The silicon oxide layer 12 having a thickness of 1.5 μm was formed on the Si layer 11 having a thickness of 10 μm. The base portion 2 had a multilayer structure of those two layers. In each of the tuning fork arms 3 to 6, the excitation portion 13 was provided by forming the piezoelectric thin film 14, made of AlN and having a thickness of 0.8 μm, on the upper surface of the multilayer structure, and by forming the electrodes, made of Mo and having respectively thicknesses of 0.1 μm and 0.1 μm, on both the surfaces of the piezoelectric thin film 14.

The length of each of the tuning fork arms 3 to 6 was set to 650 μm. A width Wo of each of the tuning fork arms 3 and 6 positioned at both the sides and a width Wi of each of the tuning fork arms 4 and 5 positioned closer to the center were set to 30 μm. In other words, widths W of the tuning fork arms 3 to 6 were all set to 30 μm. The thickness of each tuning fork arm was set to about 12.5 μm with the provision of the above-described multilayer structure.

As seen from FIG. 10, regardless of a value of Wgi/W, $k^2Q$ is increased in a range of Wgi/Wgo≥0.5. It is further seen that, in particular, $k^2Q$ is stably increased in a range of Wgi/Wgo≥1.0.

Thus, in the modification of the first embodiment, $k^2Q$ can be increased on condition of Wgi/Wgo≥0.5 and, in particular, $k^2Q$ can be stably increased on condition of Wgi/Wgo≥1.0.

Figure 2:
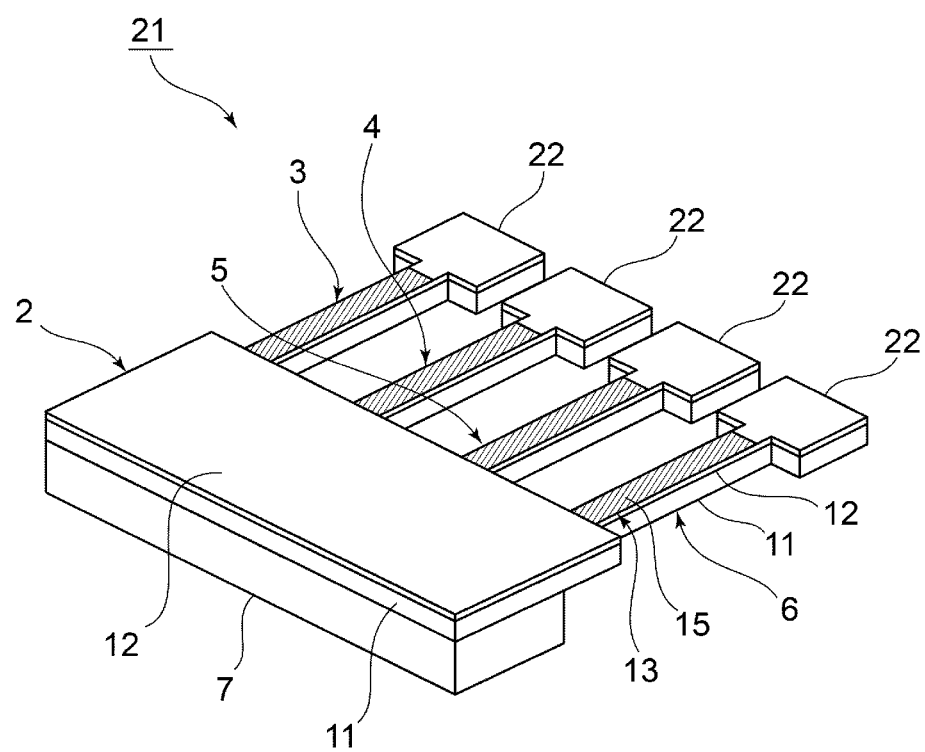
FIG. 2 is a perspective view of a vibrating device according to a second embodiment of the present invention.

FIG. 2 is a perspective view of a vibrating device of a second embodiment. The vibrating device 21 of the second embodiment is the same as that of the first embodiment except for including the mass adding portions 22 provided at respective tips of the tuning fork arms 3 to 6. Accordingly, the same parts are denoted by the same reference numerals, and the description of the first embodiment is included here by reference. In this embodiment, the mass adding portions 22 are each constituted by setting the width of the multilayer structure of the Si layer 11 and the silicon oxide layer 12 to be larger than the width of the remaining portion of the tuning fork arm. As a result, the mass adding portion 22 can apply larger mass than that applied from the remaining portion of the tuning fork arm.

The resonant frequency can be further lowered by providing the mass adding portions 22, as described above, at the respective tips of the tuning fork arms 3 to 6. Hence the overall size of the vibrating device can be reduced.

Instead of providing the mass adding portions 22, the width of a tip-side end portion of each of the tuning fork arms 3 to 6, i.e., the width of one end portion of each tuning fork arm at the side opposite to the other end portion joined to the base portion 2, may be just set to be larger than the width of the other end portion joined to the base portion 2. Also in such a case, the resonant frequency can be lowered.

Furthermore, in this embodiment, by controlling a ratio of the width of the mass adding portion 22 to the width of each of the tuning fork arms 3 to 6 to fall within a particular range, $k^2Q$ can be increased while the resonant resistance R1 is held even lower, and stability of the oscillation can be effectively increased. That point will be described in more detail below with reference to FIGS. 11 to 13.

Figure 11:
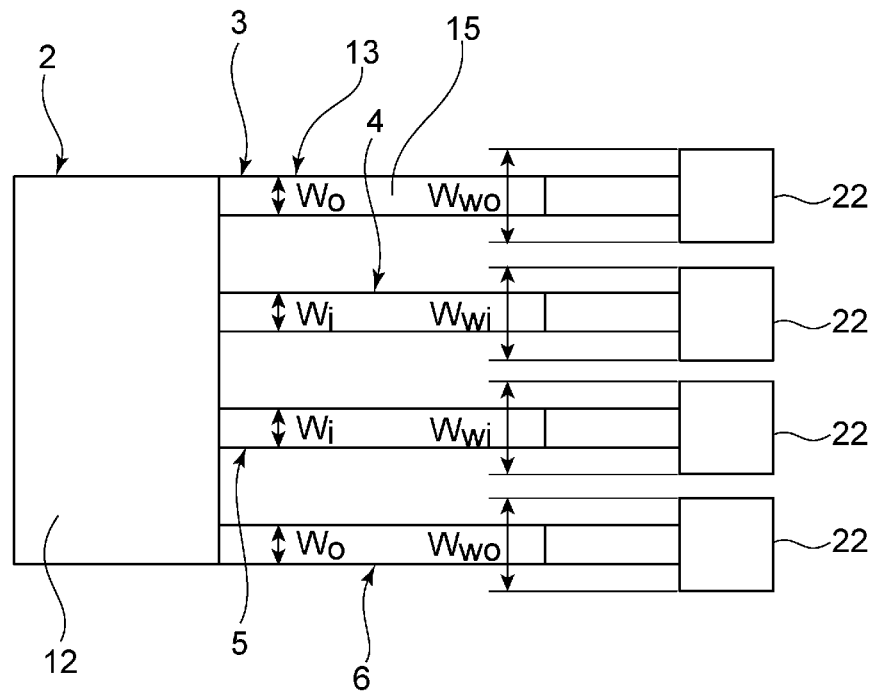
FIG. 11 is a schematic plan view of the vibrating device according to the second embodiment of the present invention.

FIG. 11 is a schematic plan view of the vibrating device according to the second embodiment of the present invention. As illustrated in FIG. 11, the width of each of the tuning fork arms 3 and 6 positioned at both the outer sides is denoted by Wo, and the width of each of the tuning fork arms 4 and 5 positioned closer to the center is denoted by Wi. Furthermore, the width of the mass adding portion 22 at the tip of each of the tuning fork arms 3 and 6 positioned at both the outer sides is denoted by Wwo, and the width of the mass adding portion 22 at the tip of each of the tuning fork arms 4 and 5 positioned closer to the center is denoted by Wwi.

Figure 12:
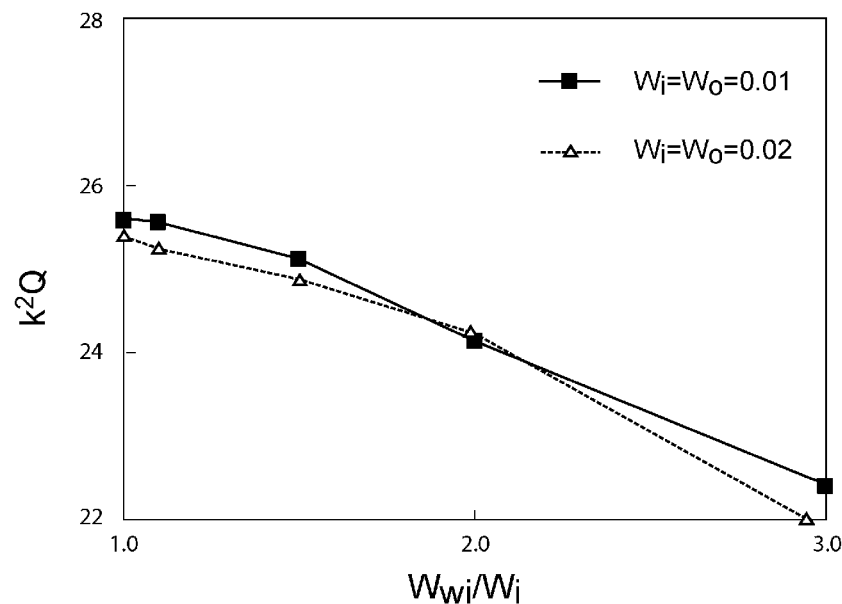
FIG. 12 is a graph depicting, in the tuning fork arm positioned closer to the center in the vibrating device according to the second embodiment of the present invention, a relationship between a ratio Wwi/Wi, i.e., a ratio of a width Wwi of a mass adding portion to a width Wi of the tuning fork arm, and $k^2Q$.
Figure 13:
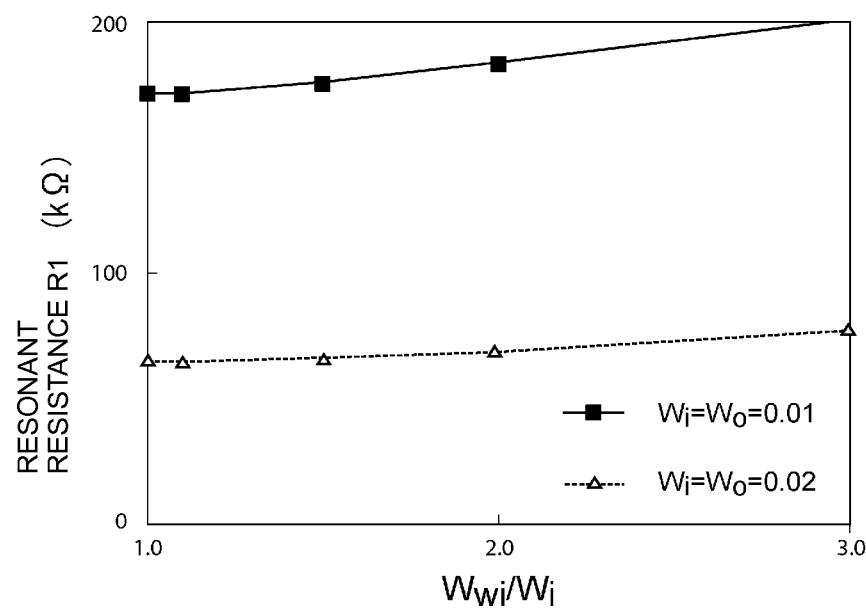
FIG. 13 is a graph depicting, in the tuning fork arm positioned closer to the center in the vibrating device according to the second embodiment of the present invention, a relationship between the ratio Wwi/Wi, i.e., the ratio of the width Wwi of the mass adding portion to the width Wi of the tuning fork arm, and resonant resistance R1.

FIG. 12 is a graph depicting a relationship between Wwi/Wi, i.e., a ratio of Wwi to Wi, and $k^2Q$, and FIG. 13 is a graph depicting a relationship between the ratio Wwi/Wi and the resonant resistance R1. To determine the relationship between the ratio Wwi/Wi and $k^2Q$ or the resonant resistance R1 in FIGS. 12 and 13, the vibrating devices were fabricated as follows.

The silicon oxide layer 12 having a thickness of 1.5 μm was formed on the Si layer 11 having a thickness of 10 μm. The base portion 2 had a multilayer structure of those two layers. In each of the tuning fork arms 3 to 6, the excitation portion 13 was provided by forming the piezoelectric thin film 14, made of AlN and having a thickness of 0.8 μm, on the upper surface of the multilayer structure, and by forming the electrodes, made of Mo and having respectively thicknesses of 0.1 μm and 0.1 μm, on both the surfaces of the piezoelectric thin film 14. Moreover, the mass adding portion 22 having a length of 195 μm was provided at the tip of each of the tuning fork arms 3 to 6.

FIGS. 12 and 13 represent the relationships between Wwi/Wi and each of $k^2Q$ and the resonant resistance R1, respectively, which were determined on condition of Wi=Wo=0.01 mm or Wi=Wo=0.02 mm.

As seen from FIGS. 12 and 13, $k^2Q$ is increased and the resonant resistance R1 is reduced more effectively in a range of 1≤Wwi/Wi≤2.

Thus, in this embodiment, by setting Wwi/Wi, i.e., the ratio of Wwi to Wi, to fall within the range of 1≤Wwi/Wi≤2, $k^2Q$ can be increased while the resonant resistance R1 is held even lower, and stability of the oscillation can be more effectively increased.

In the above-described embodiments, the silicon oxide layer 12 is laminated on the upper surface of the Si layer 11. In that case, the thickness ratio T2/(T1+T2) is given as a ratio of T2 to a total of T1+T2 as illustrated in FIG. 3(a).

Figure 3A:
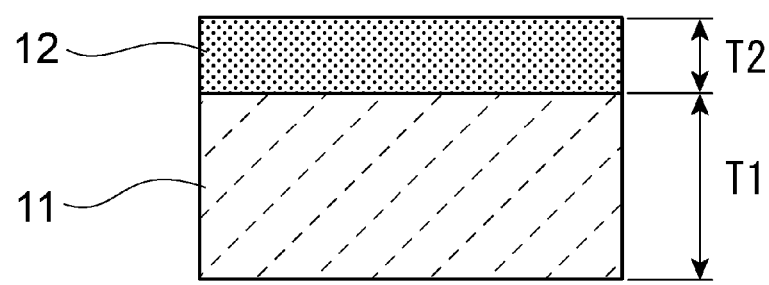
FIG. 3(a) is a cross-sectional view to explain layer thicknesses in a structure in which a silicon oxide layer is laminated on an upper surface of a Si layer.
Figure 3B:
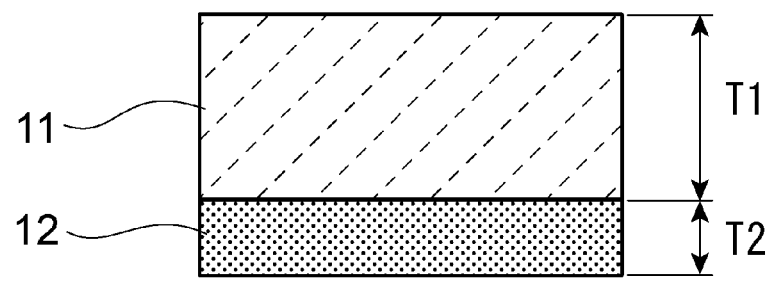
FIG. 3(b) is a cross-sectional view to explain layer thicknesses in a structure in which the silicon oxide layer is laminated on a lower surface of the Si layer.

It is to be noted that the present invention is not limited to the structure of FIG. 3(a). The silicon oxide layer 12 may be laminated on a lower surface of the Si layer 11. Even in that case, the thickness ratio T2/(T1+T2) is given as a ratio of T2 to a total of T1+T2 as illustrated in FIG. 3(b).

Figure 4:
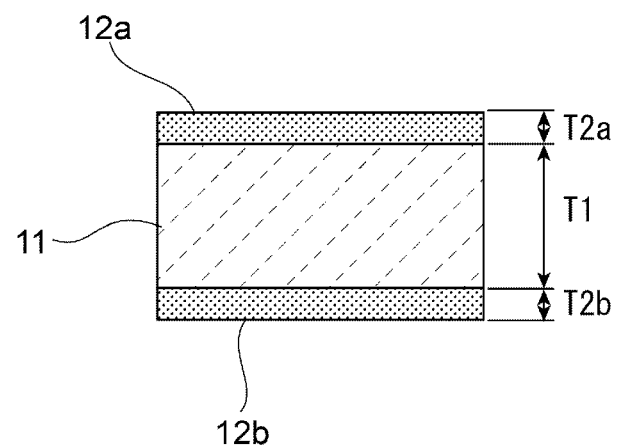
FIG. 4 is a cross-sectional view to explain layer thicknesses in a structure in which the silicon oxide layer is laminated on each of both the surfaces of the Si layer.

Furthermore, in the present invention, at least one of the Si layer 11 and the silicon oxide layer 12 may be formed by laminating a plurality of layers. In that case, T1 and T2 are each given by a total of respective thicknesses of the plural layers. For example, as illustrated in FIG. 4, a silicon oxide layer 12a may be laminated on the upper surface of the Si layer 11, and a silicon oxide layer 12b may be laminated on the lower surface of the Si layer 11. In that case, T2 may be given by T2=T2a+T2b. Stated in another way, a total of respective thicknesses of the plural silicon oxide layers may be given as T2. Similarly, when a plurality of Si layers is laminated, a total of respective thicknesses of the plural Si layers may be given as T1.

REFERENCE SIGNS LIST

1 . . . vibrating device
2 . . . base portion
3 to 6 . . . tuning fork arms
7 . . . support portion
11 . . . Si layer
12, 12a, 12b . . . silicon oxide layers
13 . . . excitation portion
14 . . . piezoelectric thin film
14a . . . piezoelectric thin film layer
15 . . . first electrode
16 . . . second electrode
21 . . . vibrating device
22 . . . mass adding portion

The invention claimed is:

1. A vibrating device comprising:
a base portion; and
a number 2N of tuning fork arms joined to one end of the base portion and extending in a first direction, N being an integer equal to 2 or larger,
wherein the number 2N of tuning fork arms are arranged side by side in a second direction that is perpendicular to the first direction, each of the tuning fork arms configured to flexurally vibrate in a third direction that is perpendicular to the second direction and the first direction,
phases of flexural vibrations of the number N of tuning fork arms positioned at a first side of an imaginary line, which passes a center of a region in the second direction where the number 2N of tuning fork arms are disposed and which extends in the first direction, are symmetric to phases of the flexural vibrations of the number N of tuning fork arms positioned at a second side of the imaginary line opposite to the first side,
the number N is two, and a first set of two tuning fork arms positioned at the first side of the imaginary line and a second set of two tuning fork arms positioned at the second side of the imaginary line have flexural vibrations in opposite phases, and
the first set of two tuning fork arms have piezoelectric layers polarized in an opposite direction to piezoelectric layers of the second set of two tuning fork arms.

2. The vibrating device according to claim 1, wherein a width of an end portion of each tuning fork arm at a side opposite to an end portion thereof joined to the base portion is larger than a width of the end portion joined to the base portion.

3. The vibrating device according to claim 2, further comprising a mass adding portion at the end portion of each tuning fork arm at the side opposite to the end portion thereof joined to the base portion, the mass adding portion having a larger width than its respective tuning form arm.

4. A vibrating device comprising:
a base portion; and
a number 2N of tuning fork arms joined to one end of the base portion and extending in a first direction, N being an integer equal to 2 or larger,
wherein the number 2N of tuning fork arms are arranged side by side in a second direction that is perpendicular to the first direction, each of the tuning fork arms configured to flexurally vibrate in a third direction that is perpendicular to the second direction and the first direction,
phases of flexural vibrations of the number N of tuning fork arms positioned at a first side of an imaginary line, which passes a center of a region in the second direction where the number 2N of tuning fork arms are disposed and which extends in the first direction, are symmetric to phases of the flexural vibrations of the number N of tuning fork arms positioned at a second side of the imaginary line opposite to the first side, the number N is two, and a first set of two tuning fork arms positioned at the first side of the imaginary line and a second set of two tuning fork arms positioned at the second side of the imaginary line have flexural vibrations in opposite phases, and a ratio of a first width between the two tuning fork arms of the first set of two tuning fork arms and a second width between the first set of two tuning fork arms and the second set of two tuning fork arms is ≥0.5.

5. A vibrating device comprising:

a base portion; and a number 2N of tuning fork arms joined to one end of the base portion and extending in a first direction, N being an integer equal to 2 or larger, wherein the number 2N of tuning fork arms are arranged side by side in a second direction that is perpendicular to the first direction, each of the tuning fork arms configured to flexurally vibrate in a third direction that is perpendicular to the second direction and the first direction, phases of flexural vibrations of the number N of tuning fork arms positioned at a first side of an imaginary line, which passes a center of a region in the second direction where the number 2N of tuning fork arms are disposed and which extends in the first direction, are symmetric to phases of the flexural vibrations of the number N of tuning fork arms positioned at a second side of the imaginary line opposite to the first side, the number N is two, and a first set of two tuning fork arms positioned at the first side of the imaginary line and a second set of two tuning fork arms positioned at the second side of the imaginary line have flexural vibrations in opposite phases, and a ratio of a first width between the two tuning fork arms of the first set of two tuning fork arms and a second width between the first set of two tuning fork arms and the second set of two tuning fork arms is ≥1.0.

6. A vibrating device comprising:

a base portion; and a number 2N of tuning fork arms joined to one end of the base portion and extending in a first direction, N being an integer equal to 2 or larger, wherein the number 2N of tuning fork arms are arranged side by side in a second direction that is perpendicular to the first direction, each of the tuning fork arms configured to flexurally vibrate in a third direction that is perpendicular to the second direction and the first direction, and phases of flexural vibrations of the number N of tuning fork arms positioned at a first side of an imaginary line, which passes a center of a region in the second direction where the number 2N of tuning fork arms are disposed and which extends in the first direction, are symmetric to phases of the flexural vibrations of the number N of tuning fork arms positioned at a second side of the imaginary line opposite to the first side, each of the tuning fork arms includes a Si layer made of a degenerate semiconductor, a silicon oxide layer, a piezoelectric layer, and first and second electrodes through which a voltage is applied to the piezoelectric layer, and a thickness ratio $T2/(T1+T2)$ is within a range of $(-0.0002x^2-0.0136x+0.0014)\pm0.05$, T1 representing a thickness of the Si layer, and T2 representing a thickness of the silicon oxide layer.

7. The vibrating device according to claim 6, wherein the number N is two, and a first set of two tuning fork arms positioned at the first side of the imaginary line and a second set of two tuning fork arms positioned at the second side of the imaginary line have flexural vibrations in opposite phases.

8. The vibrating device according to claim 6, wherein the Si layer is doped with an n-type dopant.

9. The vibrating device according to claim 8, wherein the dopant is phosphorus.

10. The vibrating device according to claim 6, wherein the Si layer is doped with an n-type dopant.

11. The vibrating device according to claim 10, wherein the dopant is phosphorus.

12. A vibrating device comprising:

a base portion; and a number 2N of tuning fork arms joined to one end of the base portion and extending in a first direction, N being an integer equal to 2 or larger, wherein the number 2N of tuning fork arms are arranged side by side in a second direction that is perpendicular to the first direction, each of the tuning fork arms configured to flexurally vibrate in a third direction that is perpendicular to the second direction and the first direction, phases of flexural vibrations of the number N of tuning fork arms positioned at a first side of an imaginary line, which passes a center of a region in the second direction where the number 2N of tuning fork arms are disposed and which extends in the first direction, are symmetric to phases of the flexural vibrations of the number N of tuning fork arms positioned at a second side of the imaginary line opposite to the first side, each of the tuning fork arms includes a Si layer made of a degenerate semiconductor, a silicon oxide layer, a piezoelectric layer, and first and second electrodes through which a voltage is applied to the piezoelectric layer, and a first set of tuning fork arms of the number 2N of tuning fork arms have their piezoelectric layers polarized in an opposite direction to the piezoelectric layers of a second set of two tuning fork arms of the number 2N of tuning fork arms.

13. The vibrating device according to claim 12, wherein the Si layer is doped with an n-type dopant.

14. The vibrating device according to claim 13, wherein the dopant is phosphorus.

15. The vibrating device according to claim 12, wherein the Si layer is doped with an n-type dopant.

16. The vibrating device according to claim 15, wherein the dopant is phosphorus.

17. The vibrating device according to claim 12, wherein the number N is two, and a first set of two tuning fork arms positioned at the first side of the imaginary line and a second set of two tuning fork arms positioned at the second side of the imaginary line have flexural vibrations in opposite phases.

\* \* \* \* \*